US009054533B2

(12) United States Patent
Gaul et al.

(10) Patent No.: US 9,054,533 B2
(45) Date of Patent: Jun. 9, 2015

(54) PROTECTIVE CIRCUIT FOR A RECHARGEABLE BATTERY PACK

(71) Applicant: Andreas Stihl AG & Co. KG, Waiblingen (DE)

(72) Inventors: Henrik Gaul, Schorndorf (DE); Gernot Liebhard, Waiblingen (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 336 days.

(21) Appl. No.: 13/726,369

(22) Filed: Dec. 24, 2012

(65) Prior Publication Data
US 2013/0162217 A1 Jun. 27, 2013

(30) Foreign Application Priority Data

Dec. 22, 2011 (DE) .......................... 10 2011 121 940

(51) Int. Cl.
| H02J 7/00 | (2006.01) |
| H01M 10/44 | (2006.01) |
| H02H 7/18 | (2006.01) |
| H01M 10/052 | (2010.01) |
| H01M 10/48 | (2006.01) |
| G01R 31/36 | (2006.01) |
| G01R 19/165 | (2006.01) |

(52) U.S. Cl.
CPC ............... *H02J 7/00* (2013.01); *H01M 10/441* (2013.01); *H02H 7/18* (2013.01); *H02J 7/0026* (2013.01); *H01M 10/052* (2013.01); *H01M 10/486* (2013.01); *G01R 31/362* (2013.01); *G01R 19/16542* (2013.01)

(58) Field of Classification Search
USPC ......... 320/116, 117, 118, 119, 145, 162, 132, 320/134, 125, 160
See application file for complete search history.

(56) References Cited

U.S. PATENT DOCUMENTS

| 5,818,201 | A | 10/1998 | Stockstad et al. |
| 6,331,764 | B1 | 12/2001 | Oglesbee et al. |
| 6,373,224 | B1 * | 4/2002 | Goto et al. ..................... 320/119 |
| 6,627,345 | B1 | 9/2003 | Zemlok et al. |

(Continued)

FOREIGN PATENT DOCUMENTS

| EP | 1 769 699 A1 | 4/2007 |
| WO | WO 02/30631 A2 | 4/2002 |

OTHER PUBLICATIONS

European Search Report of the European Patent Office dated Mar. 8, 2013 in the corresponding European patent application EP12008362.

*Primary Examiner* — Brian Ngo
(74) *Attorney, Agent, or Firm* — Ottesen P.A.

(57) ABSTRACT

The invention is directed to a protective circuit for a multiplicity of individual cells arranged in a rechargeable battery pack, wherein a predefined number of individual cells forms a cell network. A monitoring circuit for the state of charge of the individual cells in the cell network is provided wherein the voltage at an individual cell is detected and the detected voltages of a plurality of individual cells are compared among one another to output a signal when an unbalancing limit is exceeded unbalancing limit indicates a permissible voltage difference between two selected individual cells of the cell network. The unbalancing limit of the cell network is provided as a characteristic curve variable over its state of charge. To alter the unbalancing limit, the characteristic curve is altered in dependence on a correction value.

25 Claims, 4 Drawing Sheets

(56) References Cited

U.S. PATENT DOCUMENTS

| | | |
|---|---|---|
| 6,841,291 B2 | 1/2005 | Minamiura |
| 7,073,614 B2 | 7/2006 | Saito et al. |
| 7,498,774 B2 | 3/2009 | Ziegler et al. |
| 7,553,583 B2 | 6/2009 | Eaves |
| 7,592,773 B2 | 9/2009 | Pellenc |
| 8,410,756 B2 | 4/2013 | Sakakibara et al. |
| 8,691,412 B2 | 4/2014 | Yonishi |
| 2004/0138785 A1 | 7/2004 | Emori et al. |
| 2005/0057221 A1 | 3/2005 | Desilvestro et al. |
| 2005/0161305 A1 | 7/2005 | Jenni et al. |
| 2006/0071643 A1* | 4/2006 | Carrier et al. ............... 320/132 |
| 2008/0050645 A1 | 2/2008 | Kai et al. |
| 2009/0001937 A1* | 1/2009 | Densham et al. ............ 320/145 |
| 2010/0123434 A1 | 5/2010 | Iwata |
| 2010/0181966 A1 | 7/2010 | Sakakibara |
| 2010/0221590 A1 | 9/2010 | Reber |
| 2010/0221591 A1 | 9/2010 | Rosskamp et al. |
| 2010/0244781 A1* | 9/2010 | Kramer et al. ............... 320/162 |
| 2010/0321025 A1 | 12/2010 | Lin et al. |
| 2011/0001456 A1* | 1/2011 | Wang ........................... 320/117 |
| 2011/0003182 A1 | 1/2011 | Zhu |
| 2011/0068744 A1 | 3/2011 | Zhu |
| 2011/0074354 A1 | 3/2011 | Yano |
| 2011/0097619 A1 | 4/2011 | Park |
| 2011/0156649 A1* | 6/2011 | Wu .............................. 320/118 |
| 2011/0248675 A1 | 10/2011 | Shiu et al. |
| 2011/0287287 A1 | 11/2011 | Kang |
| 2013/0162052 A1 | 6/2013 | Gaul et al. |
| 2013/0162055 A1 | 6/2013 | Reber et al. |
| 2013/0163135 A1 | 6/2013 | Liebhard et al. |
| 2013/0164600 A1 | 6/2013 | Rosskamp et al. |

* cited by examiner

| DISCHARGES | SRB (5) | BCRB (3) | HTRB (1) | HOV |
|---|---|---|---|---|
| 2 | X | | | 10 |
| 2 | | | X | 2 |
| 4 | | X | | 12 |
| 8 | | | | 24 |
FIG. 4
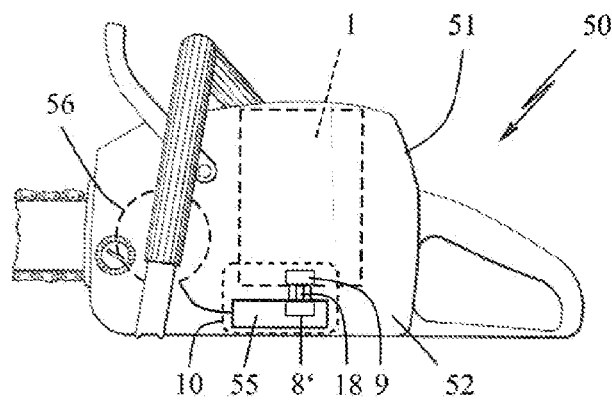
FIG. 5
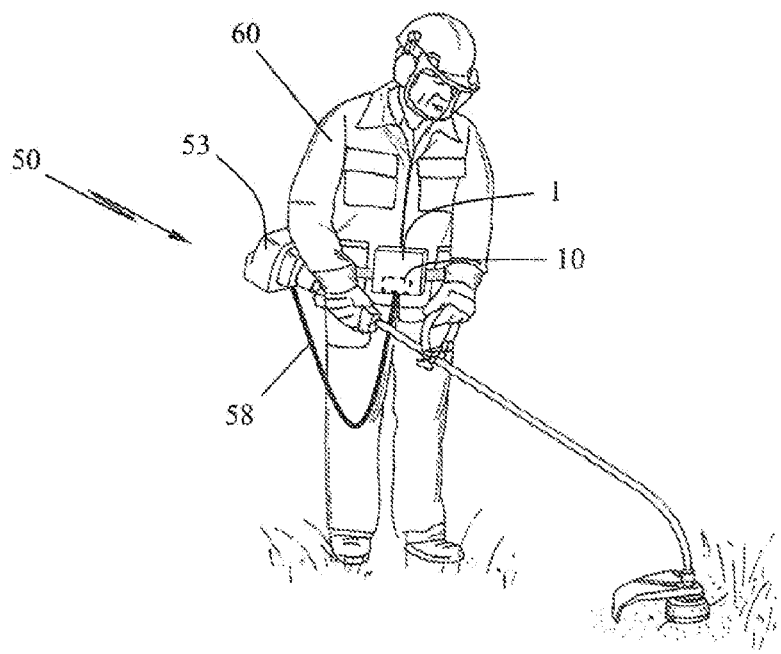
FIG. 6

| DATA DETECTION | | | DATA EVALUATION | | | | | |
|---|---|---|---|---|---|---|---|---|
| EVENT | STATE OF DISCHARGE | STATE OF CHARGE | CHARGE DIFFERENCE | CHARGING CYCLE | LIMIT VALUE OF 30% UNDERSHOT | VALUE RANGE I 30% < SOC < 75% | VALUE RANGE II 75% < SOC < 90% | LIMIT VALUE OF 90% EXCEEDED |
| Charging start | | 25% | 70% | x | xx | | | |
| Stop | | 95% | | | | | | x |
| Operation start | 95% | | 25% | | | | | x |
| Stop | 70% | | | | | x | | |
| Operation start | 70% | | 35% | | | x | | |
| Stop | 35% | | | | | x | | |
| Charging start | | 35% | 45% | x | | x | | |
| Stop | | 85% | | | | | x | |
| Operation start | 80% | | 60% | | | | x | |
| Stop | 20% | | | | xx | | | |
| Charging start | | 20% | 60% | x | xx | | | |
| Stop | | 80% | | | | | x | |
| Operation start | 80% | | | | | | x | |
| Operation stop | | | | | | | | |
| .... | | | | | | | | |
| TOTALS: | | | 295% | 3 | 3 | 4 | 4 | 2 |

FIG. 7

PROTECTIVE CIRCUIT FOR A RECHARGEABLE BATTERY PACK

CROSS REFERENCE TO RELATED APPLICATION

This application claims priority of German patent application no. 10 2011 121 940.8, filed Dec. 22, 2011, the entire content of which is incorporated herein by reference.

FIELD OF THE INVENTION

The invention relates to a protective circuit for a multiplicity of individual cells arranged in a rechargeable battery pack.

BACKGROUND OF TEE INVENTION

In a rechargeable battery pack, a multiplicity of individual cells are regularly interconnected in series and/or in parallel to provide a rechargeable battery pack having a desired supply voltage and capacity. In the new state, the individual cells have substantially an identical behavior and identical capacity; with increasing aging of the cells as a result of temperature influences, storage and loading, the performance of the individual cells will deviate from one another. Since a cell network, in particular a series circuit having individual cells, is in principle only as good as the weakest cell, measures are provided to recognize, at an early stage, that the rechargeable battery pack can no longer provide the required power levels and must be exchanged.

It is known, for monitoring a cell network composed of a multiplicity of individual cells, to feed each individual cell voltage to a monitoring circuit to detect the magnitude of each individual cell voltage. The detected voltages of the individual cells are then compared among one another in order to ascertain the maximum voltage difference between a weakest cell and a strongest cell. This voltage difference is a variable for the unbalancing of a cell network in a rechargeable battery pack; if the voltage difference is small, the individual cells of the cell network are in a good state; if the voltage difference becomes large, individual cells are significantly weaker than stronger cells, and the rechargeable battery pack is usable only to a limited extent. If the difference voltage exceeds predefined unbalancing limits, the rechargeable battery pack is switched off.

In the new state of a cell network, for precise monitoring of the unbalancing of a rechargeable battery pack, the unbalancing limit can be set narrowly; as the cell network ages, the unbalancing increases, but the rechargeable battery pack can still be used. It is only when predefined unbalancing limits are exceeded that the rechargeable battery pack has to be deactivated.

The unbalancing limit, of a cell network in a rechargeable battery pack is designed according to what maximum permissible unbalancing can still be permitted in the aging state of the individual cells; in the new state of the rechargeable battery pack, accurate monitoring is not possible on account of the large unbalancing limits. Therefore, an incipient failure of an individual cell already in the new state of a rechargeable battery pack cannot be identified.

SUMMARY OF THE INVENTION

The invention is based on the object of providing a protective circuit for a multiplicity of individual cells arranged in a rechargeable battery pack, in the case of which protective circuit precise monitoring for unbalancing of the cell network is possible even in the new state.

The protective circuit of the invention is for a multiplicity of individual cells mounted in a rechargeable battery pack wherein a pregiven number of the individual cells form a cell network having at least one operating variable. The protective circuit includes: a monitoring circuit for monitoring the charge state of the individual cells of the cell network; the monitoring circuit being operatively connected to the individual cells of the cell network for detecting respective voltages ($U_{na}$, $U_{nb}$, $U_{nc}$) applied across corresponding ones of the individual cells; the monitoring circuit being configured to compare the detected voltage ($U_{na}$, $U_{nb}$, $U_{nc}$) of several of the individual cells of the cell network to each other and output a signal when the comparison exceeds a debalancing limit assigned to the cell network; the debalancing limit ($U_{Dn}$) specifying a permissible voltage difference ($\Delta U_2$) between two selected ones of the individual cells of the cell network; the debalancing limit ($U_{Dn}$) being defined as a characteristic line (D) as a function of the charge state (SOC) of the cell network; a circuit device configured for forming a corrective value in dependence upon the operating variable of the cell network; and, the circuit device being further configured for changing the characteristic line (D) in dependence upon the corrective value to change the debalancing limit ($U_{Dn}$).

The characteristic curve of the unbalancing limit, the characteristic curve being variable over the state of charge, is designed very narrowly in the new state, such that unbalancing that occurs in the new state on account of a fault in an individual cell can be reliably identified. By way of example, the rechargeable battery pack can be switched off in the event of unbalancing occurring in the new state, in order that consequential damage is avoided.

The narrow unbalancing limit in the new state is altered in a manner dependent on a correction value over the operating time (service life), of the rechargeable battery pack, the correction value being determined in a manner dependent on at least one operating variable of the cell network. A widening of the unbalancing limit associated with the aging of the cell network is thus possible, such that an unbalancing limit adapted to the aging state of the individual cells of the cell network is always set.

This unbalancing limit is determined by the permissible difference voltage between the voltage of the fullest individual cell and the voltage of the most discharged individual cell of the cell network. In this case, in order to change this unbalancing limit, it is possible to use not only one but also a plurality of operating variables which determine jointly (for example, according to an algorithm) the correction value used for altering the unbalancing limit.

The operating variable is advantageously a historical operating variable formed from historical values collected in the past during the operation of the cell network. Thus, for example, a load collective formed over the operating time of the cell network can be set as a historical operating variable, or a temperature collective formed over the operating time of the cell network.

Since the charging process of the rechargeable battery pack, in the same way as the charging method used, influences the aging and the service life of the individual cells in a cell network, a feature of the invention provides for the charging times with different charging currents to be detected and stored in order to derive a historical operating variable of the carried-out chargings from these values. In this case, the detected charging current is expediently normalized with respect to the capacity of the charged cell network.

It can also be practical to ascertain and log the different charging methods of the rechargeable battery pack. Thus, a historical operating variable can be formed from the frequency of occurrence with which a first charging method is carried out in relation to another charging method.

Besides the charge of the rechargeable battery pack with currents of different magnitudes, the loading of the rechargeable battery pack with load currents of different magnitudes also influences the service life. Therefore, a historical operating variable is expediently derived from the operation of the rechargeable battery pack with different work apparatus, since different equipment can have different load currents. If, by way of example, an electric motor-driven chainsaw is operated with the rechargeable battery pack, currents occur (for example, 40 amperes) which are higher by factors than during operation with a hedge trimmer (for example, 4 amperes).

Individual cells of a cell network also age in a manner dependent on the stored quantity of charge. Specifically, if a cell is only partly charged and partly discharged, this loads the cell to a lesser extent than if it is fully charged and fully discharged. Therefore, provision is made for forming a historical operating variable from the cycle ratio of full charge to partial charge. In this case, the partial charge of a cell network corresponds to approximately 70% and 90%, in particular 80%, of the full charge of the cell network.

Besides the historical operating variables, current or present operating variables detected during the instantaneous operation of the rechargeable battery pack can also be taken into account when forming the correction value for the unbalancing limit. In a simple manner, the present current of the cell network, that is, the present charging current or discharging current, or else the current or present temperature of the cell network can be used as the current or present operating variable.

According to a feature of the invention, the charge stored in a cell network and/or an individual cell is used as the operating variable. Thus, the quantities of charge of the cell network and/or of the Individual cell that are determined over an operating time of the rechargeable battery pack can be logged and evaluated—expediently in a weighted manner—and the correction value can be altered on the basis of the operating variable thus obtained.

If the unbalancing limit (corrected according to operating variables) is exceeded, the protective circuit generates a signal that is used as a control signal for switching off the entire rechargeable battery pack by means of a switch. This switch is expediently an electronic switch, in particular a MOSFET.

According to an advantageous feature of the invention, the signal is fed to a control unit of the work apparatus operated from the rechargeable battery pack. After the occurrence of a signal, the control unit can drive the motor differently, in order, for example, to decrease the load current of the rechargeable battery pack. If the protective circuit multiply generates a signal on account of the unbalancing limit being repeatedly exceeded, the control unit can switch off the work apparatus or else the rechargeable battery pack.

Advantageously, the monitoring circuit is connected to an evaluation unit and together with the latter forms the protective circuit. In this case, the protective circuit, that is to say the monitoring circuit and the evaluating unit, is expediently provided in the rechargeable battery pack.

BRIEF DESCRIPTION OF THE DRAWINGS

The invention will now be described with reference to the drawings wherein:

FIG. 4 shows an example for forming a historical operating variable;

FIG. 5 is a schematic showing an electrical work apparatus on the basis of the example of a motordriven chainsaw;

FIG. 6 shows, in schemata illustration, electrical work apparatus on the basis of the example of a brushcutter; and, FIG. 7 shows a further example for forming a historical operating variable from states of charge determined over the operating time of the rechargeable battery pack.

DESCRIPTION OF THE PREFERRED EMBODIMENTS OF THE INVENTION

Figure 1:
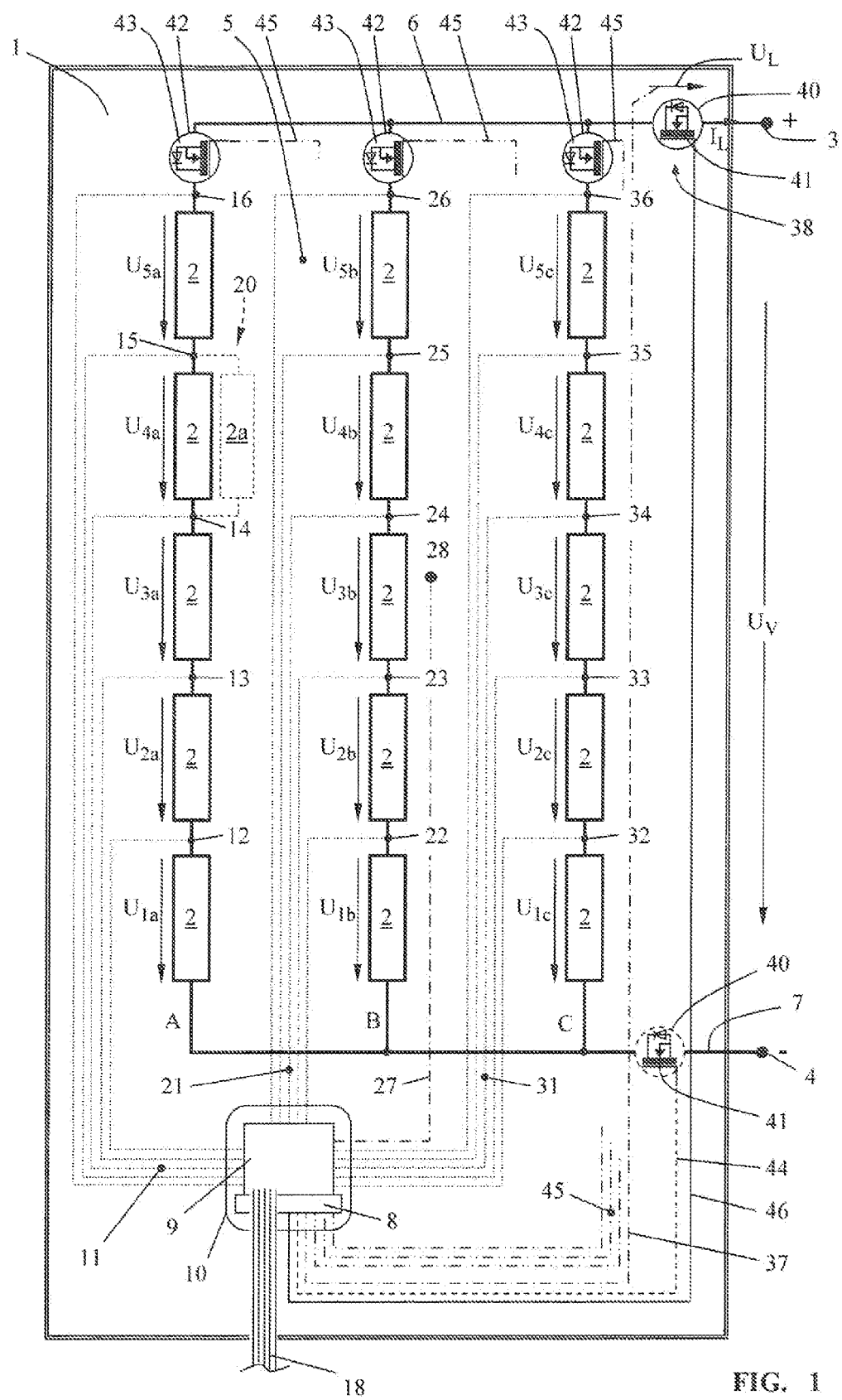
FIG. 1 is a schematic showing a rechargeable battery pack with a cell network composed of individual cells.
Figure 2:
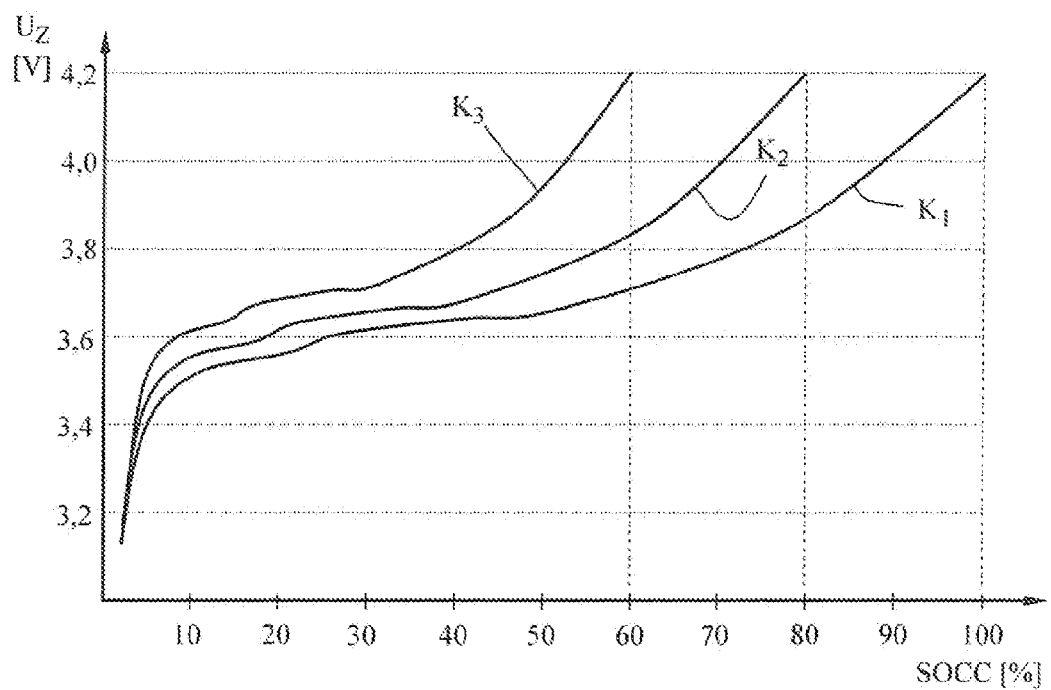
FIG. 2 shows a graph of the voltage of an individual cell as a function of the state of charge.

The rechargeable battery pack 1 illustrated in FIG. 1 consists of three cell series A, B and C, wherein in each cell series A, B and C, five individual cells 2 are situated one behind another in series connection. Each individual cell 2 of each cell series A, B and C has a cell voltage $U_{1a}$ to $U_{5a}$, $U_{1b}$ to $U_{5b}$ and $U_{1c}$ to $U_{5c}$. In the embodiment shown, the cell series are situated in parallel connection at the poles (3, 4), between which the supply voltage $U_v$ of rechargeable battery pack 1 is tapped off. Advantageously, the individual cells 2 are cells based chemically on lithium, for example, lithium-ion cells, lithium-polymer cells, lithium-iron cells or the like. The embodiment is based on a cell voltage of approximately 4.2 volts at full charge (FIG. 2), such that the maximum supply voltage $U_V$ is approximately 20 volts.

Instead of an individual cell 2, a cell block 20 can also be provided, as is indicated by dashed lines at the top left in FIG. 1. A cell block 20 can be constructed from two or more individual cells (2, 2a) which, as shown in the embodiment, are electrically connected in parallel and the terminals of which form a common potential point. The cells in a tell block 20 can also consist of a plurality of individual cells which are electrically interconnected in parallel and/or in series.

The individual cells 2 within the cell network 5 can be fabricated in an adapted manner according to the desired capacity and the desired voltage, wherein the cells 2 in a cell series A, B, C can be connected to one another either in a parallel circuit, in a series circuit or in a combination of these circuits.

The cell voltages $U_{na}$, $U_{nb}$ and $U_{nc}$ ($1 \leq n \leq 5$) are detected via signal lines 11, 21 and 31 and are fed to a monitoring circuit 9. For this purpose, the potential points 12 to 16, 22 to 26 and 32 to 36 of the cells 2 of all the cell series A, B, C are connected to the monitoring circuit 9.

The detected voltages $U_{na}$, $U_{nb}$ and $U_{nc}$ of the individual cells 2 are evaluated in an evaluation unit 8, advantageously compared with one another, in order to determine the maximum cell voltage and the minimum cell voltage $U_{min}$. The difference voltage $\Delta U_Z = U_{max} - U_{min}$ is compared with an unbalancing limit $U_{Dn}$ stored in the system.

Depending on the comparison of the difference voltage and a predefined unbalancing limit $U_{Dn}$, a signal is generated, which serves as a control signal for switching off the entire rechargeable battery pack 1 and/or individual cell series A, B, C. For this purpose, a controlled switch 40, which, in the embodiment shown, is an electronic switch, in particular a MOSFET 41, is provided in the main line 6 of the positive pole 3 and/or in the main line 7 of the negative pole 4. A controlled electronic switch 42, which is likewise embodied as a MOSFET 43, can correspondingly be provided in a cell series A, B, C. Via control lines 44 and 46, the electronic switches 40 are driven by the protective circuit 10 formed from the monitoring circuit 9 and the evaluation unit 8. Via corresponding control lines 45, the MOSFETs 43 in the cell series A, B, and C can be driven by the protective circuit 10.

Each individual cell 2 is discharged during the use of the rechargeable battery pack 1 and recharged when the rechargeable battery pack 1 is connected to a charger. Depending on the state of charge SOCC (State of Charge Cell), a cell voltage $U_Z$ is present at the individual cell 2, as reproduced in FIG. 2. As shown by the characteristic curve $K_1$, the cell voltage is approximately 3.2 volts in the case of a discharged cell 2 and rises in the case of full charge (100% SOCC) up to the end-of-charge voltage of 4.2 volts. As the cell ages, the characteristic curve is altered to a characteristic curve $K_2$ or a characteristic curve $K_3$; the cell is no longer fully charged in the case of the characteristic curves $K_2$ and $K_3$; the end-of-charge voltage is reached earlier with lower charge SOCC and leads to a charging process being switched off prematurely. In the case of a discharge, aged cells break down with the cell voltage earlier than new cells. In the embodiment in FIG. 2, an aged cell having the middle characteristic curve $K_2$ reaches a cell voltage $U_Z$=4.2 V as early as at 80% SOCC and an old cell having the characteristic curve $K_3$ reaches the cell voltage $U_Z$=4.2 V even as early as at a state of charge of 60% SOCC.

A multiplicity of individual cells 2 are assembled within a cell network 5 such as is illustrated by way of example in FIG. 1. Even if the individual cells 2 originate from the same production and bear the same production dates, they may differ slightly in their properties. If the individual cells 2 are new, their cell voltages $U_{na}$, $U_{nb}$ and $U_{nc}$ will deviate only little from one another both during discharging and during charging over their state of charge; this means that a difference voltage between a maximum cell voltage $U_{max}$ of the cell voltages $U_{na}$, $U_{nb}$ and $U_{nc}$ and a minimum cell voltage $U_{min}$ of the cell voltages $U_{na}$, $U_{nb}$ and $U_{nc}$ is small. For a typical cell network 5, in the new state this results, for example, in a characteristic curve of the unbalancing limit which indicates the difference voltage $\Delta U_Z$ permissible in a particular state of charge SOC of the cell network 5. This permissible difference voltage in the new state of the cell network 5 is between approximately 80 mV and approximately 500 mV in the case of a charge of between 10% and 90% SOC (State of Charge).

As the cells age, the difference voltage $\Delta U_Z$ between the weakest individual cell, and the strongest individual cell 2 becomes greater, which has the effect that the unbalancing limit of the unaltered characteristic curve D is often exceeded, which would lead to the rechargeable battery pack 1 being turned off.

Figure 3:
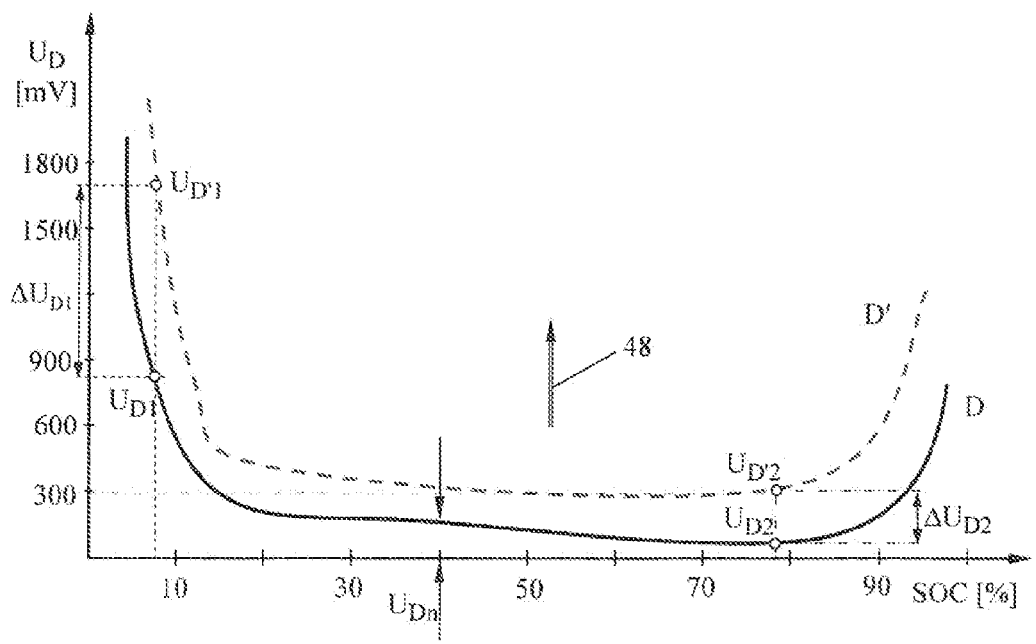
FIG. 3 shows a graph of a characteristic curve of an unbalancing limit as a function of the state of charge of the cell network.

In order to prevent this, the invention provides for altering the characteristic curve D to a characteristic curve D' in a manner dependent on a correction value. The following advantageously holds true, for example:

$$D'=k \cdot D,$$

wherein the correction value is formed in a manner dependent on at least one operating variable of the cell network 5. The graph according to FIG. 3 indicates by way of example how the characteristic curve D is altered to a characteristic curve D' in a manner dependent on a correction value k. The characteristic curve D is shifted in the direction of the arrow 48 in a simple manner, thereby shifting the unbalancing limit.

In the case of a state of charge of the cell network 5 of approximately 8%, an unbalancing limit $U_{D1}$ of approximately 800 millivolts arises in the new state; the rechargeable battery pack 1 would therefore be switched off if, under load, the cell voltages $U_{na}$, $U_{nb}$ and $U_{nc}$ of the weakest and of the strongest individual cell 2 have a difference voltage $\Delta U_Z$ of more than 800 millivolts. As the rechargeable battery pack ages, taking account of operating variables of the cell network 5, the characteristic curve D is altered to the characteristic curve D', such that then with a state of charge of the cell network 5 of approximately 8%, an unbalancing limit $U_{D'1}$ of approximately 1700 millivolts is permitted in the aged state. After the unbalancing limit has been shifted to $U_{D'1}$, therefore, the rechargeable battery pack 1 is switched off only if the difference voltage $\Delta U_Z$ of the cell voltages of the strongest cell and of the weakest cell is above 1700 millivolts.

Accordingly, for example, in the case of a state of charge SOC of the new cell network 5 of approximately 80%, the rechargeable battery pack is switched off when an unbalancing limit of approximately 80 millivolts is exceeded; in the case of the characteristic curve that is altered in the course of operation, the unbalancing limit will rise to $U_{D'2}$ and then be at approximately 300 millivolts in the case of an old cell network 5. As a result of the adaptation of the unbalancing limit $U_{Dn}$ on the basis of operating variables of the cell network, a shift in the unbalancing limit by $\Delta U_{U1}$ of approximately 900 millivolts arises in the case of a state of charge SOC of approximately 8%, while the unbalancing limit shifts by $\Delta U_{D2}$ of approximately 200 millivolts in the region of approximately 80% state of charge SOC.

The unbalancing limit is present as a characteristic curve D in a simple manner; the characteristic curve D can also be represented as a concrete characteristic curve, as discrete values, as a family of characteristic curves or as an algorithm. The term "characteristic curve" summarizes these and further (not explicitly mentioned) embodiments and representations of the unbalancing limit in dependence on the state of charge SOC. The correction value k used for altering the characteristic curve of the unbalancing limit can be a proportional factor or else an algorithm. The correction value k is formed in a manner dependent on at least one operating variable of the cell network 5. In order to achieve a good adaptation to the aging state of the individual cells 2, provision is made for forming the correction value k in a manner dependent on a plurality of operating variables. In this case, the operating variable can be a historical operating variable HOV formed from historical values collected in the past during the operation of the cell network 5, and/or can be a current or present operating variable POV reproducing the instantaneous state of the cell network 5 in the rechargeable battery pack 1. In order to detect the instantaneous state of the cell network 5, provision is made of a temperature sensor 28 and/or a sensor 38 for detecting the load current $I_L$ flowing in the main lead (6, 7). In a simple manner, the load current $I_L$ is detected by means of the load voltage $U_L$ dropped across the electronic switch 40, namely across the internal resistance of the MOSFET 41. The voltage $U_L$ dropped is fed to the protective circuit 10 via a signal line 37. In the same way, the signal of the temperature sensor 28 is fed to the protective circuit 10 via a signal line 27. If, by way of example, a high current will flow during the charging of the cell network 5, then cells having a higher internal resistance will have a greater cell voltage $U_Z$ than cells having a low internal resistance. In the case of a high charging current, therefore, the unbalancing limit can be shifted in the direction of the arrow 48 in order—if the charging current falls—to shift the characteristic curve D' of the unbalancing limit back again counter to the direction of the arrow 48 in the sense of a smaller unbalancing.

The detected temperature values of the sensor 38 can be summed over the entire operating time of the rechargeable battery pack 1 and be written to a memory. A temperature population formed from these values can then be used as a historical operating variable for shifting the unbalancing limit.

In the same way, the load currents $I_L$ flowing in the main line (6, 7) can be detected over the entire operating time (lifetime) of the rechargeable battery pack and can be stored in order to derive a load collection from these stored values, which can be utilized for shifting the unbalancing limit $U_{Dn}$. Since the type of charge of the individual cells 2 of the cell network 5 is a variable having a considerable influence on the aging of the individual cells 2, a development of the invention provides for detecting the type of charging process by which the cell network 5 has been charged in the past. This is because it is of significant importance whether a rechargeable battery pack is only ever charged with very high currents or is charged with lower currents. Frequent charging with high currents leads to rapid aging of the cells and thus to a greater shift in the characteristic curve D of the unbalancing limit than charging processes with lower currents. However, provision is made for assessing the charging processes depending on the magnitude of the charging currents and for forming a historical operating variable from the elapsed charging times with different charging currents. In this case, the recorded charging current is normalized with respect to the capacity of the charged cell network, since a cell network 5 having a higher capacity can be charged without damage with a higher current than a cell network 5 having a lower capacity.

In a simple manner, the type of charging method can also be used as a historical operating variable. If a cell network 5 composed of lithium-ion cells is regularly charged according to the standard charging method of constant current/constant voltage, this affects the aging of the cells differently than, for example, an adapted pulse charging method. Thus, provision is made for determining and storing the frequency with which a charging method is performed, and for deriving from these values—if appropriate in a weighted manner—a historical operating variable that is used for determining the correction value.

The frequency with which the rechargeable battery pack 1 is operated with different electrical equipment 50 can also be derived as a historical operating variable. The operation of a motor-driven chain saw 51 (FIG. 5) with the rechargeable battery pack 1 loads the cell network 5 to a significantly greater extent than, for example, operation with a brushcutter 53 (FIG. 6), a blower, a hedge trimmer or such like electrical equipment. Therefore, the number of rechargeable-battery charges conducted with a rechargeable-battery motor-driven chain saw (SRB), a rechargeable-battery brushcutter (BCRB) or a rechargeable-battery hedge trimmer (HTRB) is logged and stored. FIG. 4 shows an example for forming a historical operating variable HOV taking account of the use of the rechargeable battery pack 1 with different work apparatus 50. The table shows by way of example that a rechargeable battery pack 1 was used, for example, for two rechargeable-battery charges with an electric motor-driven chain saw, two rechargeable-battery charges with an electric hedge trimmer and four rechargeable-battery charges with an electric brushcutter. Since the electrical leading of the rechargeable battery pack 1 with the motor-driven chain saw is very high, the rechargeable-battery charge is weighted, for example, with the factor 5, that of the brushcutter with the factor 3 and that of the hedge trimmer with the factor 1. This results in historical operating variables (HOV) depending on the weighted rechargeable-battery charges; in the embodiment according to FIG. 4, the sum of the values results in an average weighted historical operating variable of 3 (HOV=24:8). The higher this historical operating variable, the greater the extent to which the characteristic curve of the unbalancing limit is corrected and the greater the extent to which the characteristic curve D is shifted, for example, in the direction of the arrow 48.

In the embodiment shown according to FIG. 1, the protective circuit 10 is accommodated completely in the housing of the rechargeable battery pack 1; consequently, the evaluation unit 8 lies within the rechargeable battery pack 1, such that the latter can initiate a switch-off of the rechargeable battery pack autonomously in a manner dependent on the evaluated cell voltages. The arrangement of the protective circuit 10 in the rechargeable, battery pack 1 is advantageous, for example, if the rechargeable battery pack is worn by the user 60 and is connected to the electrical work apparatus 50 via a connecting cable 58, as shown in FIG. 6.

If the rechargeable battery pack 1 is inserted into a work apparatus housing 52, the evaluation of the detected cell voltages ($U_{na}$, $U_{nb}$, $U_{nc}$) can be performed in an evaluating unit 8' which can be integrated, for example, in a control unit 55 of the work apparatus 50. The control unit 55 controls the electric drive motor 56 of the work apparatus. The protective circuit 10 is thus formed firstly by the monitoring circuit 9 in the rechargeable battery pack 1 and secondly by the evaluation unit 8' in the equipment housing 52.

The signal generated by the protective circuit 10 when the unbalancing limit $U_{Dn}$ is exceeded can be processed in the control unit 55 in such a way that, depending on the occurrence of the signal of the protective circuit 10, the drive motor 56 is driven differently, for example, is driven with a lower current. It is only if the unbalancing limit $U_{Dn}$ has been exceeded, for example, multiply in dependence on the state of charge SOC of the cell network 5, that the work apparatus 50 is switched off by the control unit 55 and/or the switches (40, 42) in the rechargeable battery pack are opened via communication link 18 between the rechargeable battery pack 1 and the control unit 55.

The lifetime of a cell network, in particular a cell network of individual cells 2 based chemically on lithium, is also influenced by whether the cell network is only partly charged or fully charged in charging cycles. Therefore, provision is made for forming a historical operating variable as a cycle ratio of full charge to partial charge and allowing, this to influence the correction of the characteristic curve of the unbalancing limit. In this case, the partial charge of a cell network can correspond to approximately 70% to 90% of the total capacity, but in particular 80% of the full charge of a cell network 5.

Generally a correction value k can be specified as follows:

$$k=f(HOV;POV)$$

wherein: HOV=historical operating variable and POV=the current or present operating variable.

As an additional or as a further operating variable, which can b a present or a historical operating variable, in accordance with illustration in FIG. 7, it is possible to detect and store the state of charge SOCC of an individual cell 2 or the state of charge SOC of the cell network 5. Thus, when the rechargeable battery pack 1 is connected to a charger, the instantaneous state of charge of the cell network 5 can be detected and stored. According to row 1 of the table, the state of charge is, for example, 25% SOC; this state of charge is below a predefined lower limit value set, for example at 30%. This, too, is recorded and logged.

After the conclusion of the charging process, the rechargeable battery pack is charged, for example, at 95% SOC; this state exceeds a predefined upper limit value of the state of charge of for example, 90%, for which reason this event is also recorded.

The charged rechargeable battery pack 1 is then disconnected from the charger and put into operation, for example, inserted into electrical work apparatus 50 (FIGS. 5, 6). Here, too, the state of charge upon electrical activation of the rechargeable battery pack 1 is logged, in the same way as the state of charge at the end of an operating time of the work apparatus 50. Accordingly, the values 90% and 70% are entered as examples in rows 3 and 4 of the table according to FIG. 7. On the next occasion when the work apparatus 50 is operated, the start values and end values of the states of charge are once again detected and stored. The same applies to every renewed charging process. All these values are evaluated in a suitable manner and used for forming an operating variable.

A historical operating variable HOV can be formed, for example, by determining all charged or discharged partial charges during the lifetime of the rechargeable battery pack 1 (for example, by means of difference formation; and adding them to form a total quantity of charge, such that the performance of the rechargeable battery pack 1 by means of the total quantity of charge can be used for calculating the correction value.

A further possibility for forming a historical operating variable is, for example, the numerical number of the charging processes carried out in the past, which can be purposefully related to the total quantity of charge of the rechargeable battery pack.

Moreover, in this way, in each case when the present state of charge it is possible to ascertain whether the state of charge lies below a predefined limit value, in a first value range I of, for example, 30%<SOC<75%, in a second value range II of, for example, 75%<SOC<90%, or above a limit value of, for example, 90% SOC. The events that occur in each case can be weighted in order to add the numerical values obtained, to normalize the values or to process them in some other way. The numerical value obtained allows a statement to be made about the aging state of the cell network and/or of the individual cell, since the value obtained is a measure of the historical loading of the individual cells or of the cell network, which influences the aging profile of the individual cells assembled in the rechargeable battery pack.

It is understood that the foregoing description is that of the preferred embodiments of the invention and that various changes and modifications may be made thereto without departing from the spirit and scope of the invention as defined in the appended claims.

What is claimed is:

1. A protective circuit for a multiplicity of individual cells mounted in a rechargeable battery pack wherein a pregiven number of the individual cells form a cell network having at least one operating variable, the protective circuit comprising:
    a monitoring circuit for monitoring the charge state of the individual cells of said cell network;
    said monitoring circuit, being operatively connected to said individual cells of said cell network for detecting respective voltages ($U_{na}$, $U_{nb}$, $U_{nc}$) applied across corresponding ones of said individual cells;
    said monitoring circuit being configured to compare the detected voltage ($U_{na}$, $U_{nb}$, $U_{nc}$) of several of said individual cells of said cell network to each other and output a signal when the comparison exceeds a debalancing limit ($U_{Dn}$) assigned to said cell network;
    said debalancing limit ($U_{Dn}$) specifying a permissible voltage difference ($\Delta U_z$) between two selected ones of said individual cells of said cell network;
    said debalancing limit ($U_{Dn}$) being defined as a characteristic line (D) as a function of the charge state (SOC) of said cell network;
    a circuit device configured for forming a corrective value in dependence upon said operating variable of said cell network; and,
    said circuit device being further configured for changing said characteristic line (D) in dependence upon said corrective value to change said debalancing limit ($U_{Dn}$).

2. The protective circuit of claim 1, wherein said debalancing limit ($U_{Dn}$) is formed by the permissible difference voltage ($\Delta U_Z$) between the voltage ($U_{na}$, $U_{nb}$, $U_{nc}$) of the fullest one of said individual cells of said cell network and the voltage ($U_{na}$, $U_{nb}$, $U_{nc}$) of the emptiest one of said individual cells of said cell network.

3. The protective circuit of claim 2, wherein said cell network has a plurality of said operating variables; and, said corrective value is formed in dependence upon several ones of said operating variables.

4. The protective circuit of claim 1, wherein said operating variable is a historical operating variable formed from historic values collected in the past during operation of said cell network.

5. The protective circuit of claim 4, wherein said historic operating variable, is a load collective formed over the operating time of said cell network.

6. The protective circuit of claim 5, wherein said historic operating variable is a temperature collective formed over the operating time of said cell network.

7. The protective circuit of claim 6, wherein said cell network is charged up with a charge current ($I_L$) and said historic operating variable is formed from past charged times having different charge currents ($I_L$).

8. The protective circuit of claim 7, wherein the detected charge current ($I_L$) is normalized with reference to the capacity of the charged cell network.

9. The protective circuit of claim 8, wherein said cell network is charged with different charge methods and said historic operating variable is formed from the frequency of occurrence of a first charging method in comparison to another charging method.

10. The protective circuit of claim 4, wherein said historic operating variable is derived from the operation of the rechargeable battery pack with different work apparatus.

11. The protective circuit of claim 4, wherein said historic operating variable has a cyclical ratio of full charges to part charges.

12. The protective circuit of claim 11, wherein the part charge of a cell network corresponds to approximately 70% to 90% of the full charge.

13. The protective circuit of claim 12, wherein the part charge of a cell network corresponds to approximately 80% of the full charge.

14. The protective circuit of claim 1, wherein said operating variable is an instantaneous operating variable detected in a current operation of the rechargeable battery pack.

15. The protective circuit of claim 14, wherein said instantaneous operating variable is the current or present current ($I_L$) of said cell network.

16. The protective circuit of claim 14, wherein said instantaneous operating variable is the current or present temperature of said cell network.

17. The protective circuit of claim 1, wherein said operating variable is the charge (SOC; SOCC) stored in a cell network or in one of said individual cells.

18. The protective circuit of claim 17, wherein the charge states of said cell network and/or said one individual cell are evaluated; and, said charge states are determined over an operating duration of said rechargeable battery pack.

19. The protective circuit of claim 1, wherein said cell network includes a switch; and, said signal is applied as a control signal for switching off the entire rechargeable battery pack via said switch.

20. The protective circuit of claim 1, wherein the individual cells of said cell network are arranged in several cell rows; and, said protective circuit further comprises a switch in each of said rows; and, said circuit device is further configured to drive the switches in corresponding ones of said cell rows.

21. The protective circuit of claim 20, wherein each of said switches is a MOSFET.

22. The protective circuit of claim 1, wherein said cell network connected to an electric work apparatus including an electric motor and a control unit for said electric motor; and, said control unit is configured to drive said electric motor in dependence upon said signal.

23. The protective circuit of claim 22, wherein said circuit device includes an evaluation unit operatively connected to said monitoring unit and said evaluation unit and said monitoring unit are mounted in said work apparatus.

24. The protective circuit of claim 1, wherein each of said individual cells is based chemically on lithium.

25. The protective circuit of claim 1, wherein each of said individual cells are lithium-ion cells.

* * * * *

UNITED STATES PATENT AND TRADEMARK OFFICE
CERTIFICATE OF CORRECTION

| | |
|---|---|
| PATENT NO. | : 9,054,533 B2 |
| APPLICATION NO. | : 13/726369 |
| DATED | : June 9, 2015 |
| INVENTOR(S) | : H. Gaul et al. |

It is certified that error appears in the above-identified patent and that said Letters Patent is hereby corrected as shown below:

In Title Page:
Under (57) Abstract, line 9: delete "exceeded" and substitute -- exceeded. The -- therefor.

In the Specification:
In column 1:
Line 16: delete "TEE" and substitute -- THE -- therefor.

In column 2:
Line 16: insert -- ($U_{Dn}$) -- after "limit".
Line 18: delete "($\Delta U_2$)" and substitute -- ($\Delta U_z$) -- therefor.

In column 4:
Line 12: delete "schemata" and substitute -- schematic -- therefor.
Line 40: delete "tell" and substitute -- cell -- therefor.
Line 57: insert -- ($U_{max}$) -- after "mum cell voltage".
Line 60: insert -- ($\Delta U_z$) -- after "voltage".

In column 5:
Line 36: insert -- ($\Delta U_z$) -- after "voltage".
Line 40: insert -- D -- after "curve".
Line 64: insert -- ($U_{Dn}$) -- after "limit".

In column 6:
Line 63: delete "D′ Of" and substitute -- D′ of -- therefor.

In column 7:
Line 59: delete "leading" and substitute -- loading -- therefor.

Signed and Sealed this
Eighth Day of December, 2015

Michelle K. Lee
*Director of the United States Patent and Trademark Office*

CERTIFICATE OF CORRECTION (continued)
U.S. Pat. No. 9,054,533 B2

<u>In the Specification</u>:
<u>In column 8</u>:
Line 29: delete "away" and substitute -- a way -- therefor.
Line 36: insert -- a -- after "via".
Line 56: delete "b" and substitute -- be -- therefor.
Line 57: insert -- the -- after "with".

<u>In column 9</u>:
Line 21: delete "formation;" and substitute -- formation) -- therefor.
Line 31: insert -- detecting -- after "when".

<u>In the Claims</u>:
<u>In column 11</u>:
Line 20: insert -- is -- after "network".